(12) United States Patent
Morand et al.

(10) Patent No.: US 11,735,998 B2
(45) Date of Patent: Aug. 22, 2023

(54) SYSTEM AND METHOD FOR PROTECTING POWER SEMICONDUCTOR OF HALF BRIDGE CONVERTER

(71) Applicant: MITSUBISHI ELECTRIC CORPORATION, Tokyo (JP)

(72) Inventors: Julien Morand, Rennes (FR); Stefan Mollov, Rennes (FR)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 299 days.

(21) Appl. No.: 17/298,180

(22) PCT Filed: Nov. 14, 2019

(86) PCT No.: PCT/JP2019/045522
§ 371 (c)(1),
(2) Date: May 28, 2021

(87) PCT Pub. No.: WO2020/161986
PCT Pub. Date: Aug. 13, 2020

(65) Prior Publication Data
US 2022/0115945 A1    Apr. 14, 2022

(30) Foreign Application Priority Data
Feb. 7, 2019  (EP) .................................. 19156069

(51) Int. Cl.
*H02M 1/32* (2007.01)
*H02M 1/088* (2006.01)
(Continued)

(52) U.S. Cl.
CPC ........... *H02M 1/32* (2013.01); *H02M 1/0009* (2021.05); *H02M 1/088* (2013.01); *H02M 1/38* (2013.01)

(58) Field of Classification Search
CPC ...... H02M 1/32; H02M 1/0009; H02M 1/088; H02M 1/38
See application file for complete search history.

(56) References Cited

U.S. PATENT DOCUMENTS

| 11,349,403 B2* | 5/2022 | Shiomi | H02M 3/33584 |
| 2016/0191042 A1* | 6/2016 | Lizama | H03K 17/74 |
| | | | 327/399 |
| 2019/0131964 A1* | 5/2019 | Bryant | H03K 17/74 |

FOREIGN PATENT DOCUMENTS

| DE | 10 2015 009 092 A1 | 1/2016 |
| WO | WO 2016/008594 A1 | 1/2016 |

* cited by examiner

*Primary Examiner* — Rafael O De Leon Domenech
(74) *Attorney, Agent, or Firm* — Birch, Stewart, Kolasch & Birch, LLP (57) ABSTRACT

A current going through the first power semiconductor is sensed by a first and a second current derivative sensing means, the current going through the second semiconductor is sensed by a third and a fourth current derivative sensing means, when the current going through the first power semiconductor increases, the first current derivative means providing a positive voltage and the second current derivative means providing an opposite negative voltage, when the current going through the second power semiconductor increases, the third current derivative means providing a positive voltage and the fourth current derivative means providing an opposite voltage and the system reduces the voltage on the gate of the first power semiconductor if the first and third current derivative means provide voltages of same sign and reduces the voltage on the gate of the second power semiconductor if the second and fourth current derivative means provide voltages of same sign.

9 Claims, 4 Drawing Sheets

(51) Int. Cl.
*H02M 1/00* (2006.01)
*H02M 1/38* (2007.01)

Fig. 5 though the first power semiconductor increases and the second current derivative means providing a negative voltage when the current going through the first power semiconductor increases, the third current derivative means providing a positive voltage when the current going through the second power semiconductor increases and the fourth current derivative means providing a negative voltage when the current going through the second power semiconductor increases, and the system comprises:

means for lowering the voltage on the gate of the first power semiconductor if the first and third current derivative means provide voltages of same sign, means for lowering the voltage on the gate of the second power semiconductor if the second and third current derivative means provide voltages of same sign.

The present invention concerns also a method for protecting at least two power semiconductors of a half bridge converter, a drain of a first power semiconductor is connected to a positive power supply, a source of the first power semiconductor is connected to a load and to a drain of a second power semiconductor, a source of the second power semiconductor is connected to a negative power supply, characterized in that the current going through the first power semiconductor is sensed by a first and a second current derivative sensing means, the current going through the second semiconductor is sensed by a third and a fourth current derivative sensing means, the first current derivative means providing a positive voltage when the current going through the first power semiconductor increases and the second current derivative means providing a negative voltage when the current going through the first power semiconductor increases, the third current derivative means providing a positive voltage when the current going through the second power semiconductor increases and the fourth current derivative means providing a negative voltage when the current going through the second power semiconductor increases, and the method comprises the steps of:

lowering the voltage on the gate of the first power semiconductor if the first and third current derivative means provide voltages of same sign, lowering the voltage on the gate of the second power semiconductor if the second and third current derivative means provide voltages of same sign.

SYSTEM AND METHOD FOR PROTECTING POWER SEMICONDUCTOR OF HALF BRIDGE CONVERTER

TECHNICAL FIELD

The present invention relates generally to a method and a system for protecting at least two power semiconductors of a half bridge converter.

BACKGROUND ART

Today, the switching frequency of power converters is increasing. Wide-band gap devices like GaN and SiC semiconductors provide faster switching capabilities than classical technologies.

Wide band gap power semiconductor devices are able to switch at a high speed like for example superior to 10V/ns. This reduces the switching losses, and thus allows the use of higher switching frequencies.

During power converter operation, many faults can occur on the power converter. Among all of these possible faults, the short-circuit fault is a major one. Due to its destructive potential, the short-circuit issue can't be overlooked and needs to be addressed with care.

Currently, Silicon power transistors have the ability to withstand a Short-Circuit (SC) during a period of time of tenth of µseconds. With the recent emergence of Wide Band Gap (WBG) devices such as Silicon Carbide (SiC) or Gallium Nitride (GaN), the robustness of these new components in view of short-circuit have been questioned and investigated and it seems that they suffer of a significant reduction in the robustness of these devices. Although the mechanism involved in the short circuit behaviour is not fully known, it seems that the chip size reduction, due to a higher current density, is one of the reasons in this decrease in robustness.

As Wide Band Gap semiconductors have a limited capability to withstand a short-circuit, the short-circuit detection time becomes crucial. With current GaN devices, the short-circuit duration has to be lower than 200 ns to ensure the integrity of the semiconductor. During this time, the short-circuit has to be confidently detected, then latched and finally stopped by the gate buffer stage. The latching stage and the buffer stage have a propagation delay. In addition, some filtering may be required to avoid any spurious behaviour. By subtracting all these delays to the short-circuit time, we obtain a minimum detection and reaction time of the protection scheme in the region of tens of nanoseconds.

SUMMARY OF INVENTION

The present invention aims to allow a fast protection of power semiconductors of a half bridge converter.

To that end, the present invention concerns a system for protecting at least two power semiconductors of a half bridge converter, a drain of a first power semiconductor is connected to a positive power supply, a source of the first power semiconductor is connected to a load and to a drain of a second power semiconductor, a source of the second power semiconductor is connected to a negative power supply, characterized in that the current going through the first power semiconductor is sensed by a first and a second current derivative sensing means, the current going through the second semiconductor is sensed by a third and a fourth current derivative sensing means, the first current derivative means providing a positive voltage when the current going

SUMMARY OF INVENTION

Thus, the present invention is directly controlling current in the switch during a short-circuit event by the gate voltage. This control increases the capability of the switch to withstand a short-circuit because the robustness of the switch to a short-circuit is related to the short-circuit current.

According to a particular feature, the system further comprises, for each current derivative sensing means, a filter for filtering the voltage provided by the current derivative sensing means.

Thus, any spurious current derivative or parasitic voltage coupled to the measured signal will be rejected by the filter.

According to a particular feature, the system further comprises, for each current derivative sensing means, an amplifier for amplifying the filtered voltage provided by the current derivative sensing means.

Thus, the measured signal from the current derivative means will be able to control the gate voltage without loading the sensor.

According to a particular feature, the amplifier amplifying the filtered signal provided by the first current derivative sensing means is composed of a first transistor and a first resistor, the collector of the first transistor is connected to the gate of the first power semiconductor device, the emitter of the first transistor is connected to a first terminal of the first resistor, the amplifier amplifying the filtered signal provided by the third current derivative sensing means is composed of a second transistor and a second resistor, the collector of the second transistor is connected to a second terminal of the first resistor, the emitter of the second transistor is connected to a first terminal of the second resistor and the second terminal of the second resistor is linked to a first negative voltage source.

Thus, the series connection of the two transistors activates the amplifier stage only when both output voltages of the current derivative means are positive.

According to a particular feature, the system further comprises means for interrupting the providing of signals to the gate of the first power semiconductor if the first and third current derivative means provide voltages of same sign, the means for interrupting the providing of signals to the gate of the first power semiconductor comprising a third resistor used as a current sensor, a first comparator the output of which is connected to an input of the gate driver of the first power semiconductor and a third resistor that links the second terminal of the second resistor to the negative voltage source.

Thus, the state of the amplifier is known by monitoring the current in the amplifier. The voltage reference of the comparator is adjusted to a given level that corresponds to a short-circuit event.

According to a particular feature, the amplifier amplifying the filtered signal provided by the second current derivative sensing means is composed of a third transistor and a fourth resistor, the collector of the third transistor is connected to the gate of the second power semiconductor device, the emitter of the third transistor is connected to a first terminal of the fourth resistor, the amplifier amplifying the filtered signal provided by the third current derivative sensing means is composed of a fourth transistor and a fifth resistor, the collector of the fourth transistor is connected to a second terminal of the fourth resistor, the emitter of the fourth transistor is connected to a first terminal of the fifth resistor and the second terminal of the fifth resistor is linked to a second negative voltage source.

Thus, the amplifier will be active only when both output voltages of the current derivative means are positive.

According to a particular feature, the system further comprises means for interrupting the providing of signals to the gate of the second power semiconductor if the second and fourth current derivative means provide voltages of same sign, the means for interrupting the providing of signals to the gate of the second power semiconductor comprising a sixth resistor, a comparator the output of which is connected to a gate driver of the first power semiconductor, and a resistor that links the second terminal of the second resistor to the second negative voltage source.

Thus, the state of the amplifier is known by monitoring the current in the amplifier. The voltage reference of the comparator is adjusted to a given level that corresponds to a short-circuit event.

According to a particular feature, the means for interrupting the providing of signals to the gate of the power semiconductors further comprise a memory that memorizes a low to high transition of the comparator.

Thus, the short-circuit default is latched up for future process by the gate driver. Since the mean for lowering the gate voltage is controlling the short-circuit current, the system needs to memorize any short-circuit events in order to take the suitable action.

According to a particular feature, the current derivative sensing means are Rogowski coils.

Thus, the current derivative is directly sensed by the means and does not require any pre-processing before entering in the amplifier stage.

The characteristics of the invention will emerge more clearly from a reading of the following description of example embodiments, the said description being produced with reference to the accompanying drawings.

DESCRIPTION OF EMBODIMENTS

Figure 1:
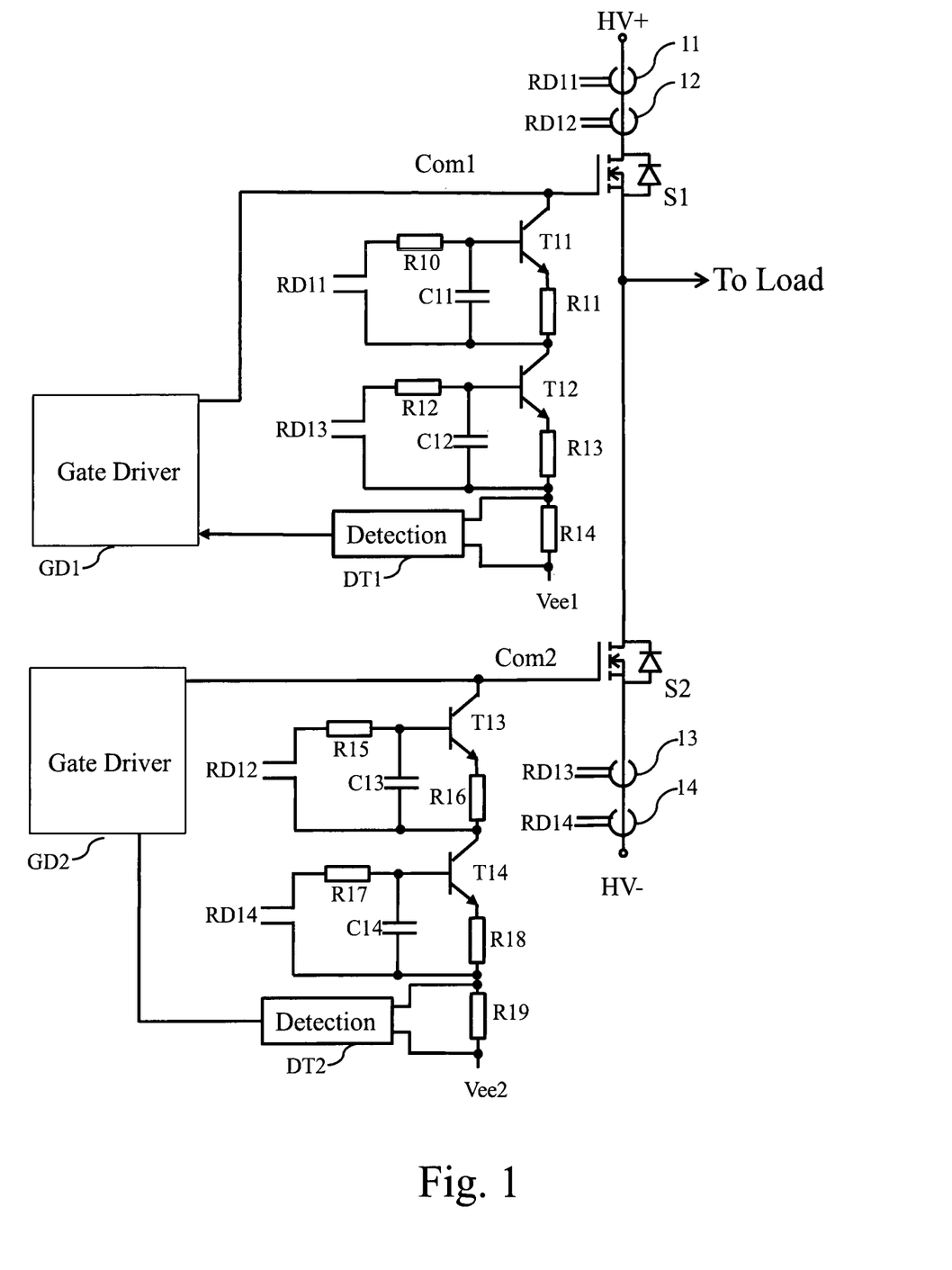
FIG. 1 represents an example of an architecture of a half bridge configuration in which the present invention may be implemented.

FIG. 1 represents an example of an architecture of a half bridge configuration in which the present invention may be implemented.

In the example of FIG. 1, two gate drivers GD1 and GD2 control the switching of two power semiconductors S1 and S2 using the respective signals Com1 and Com2 that are applied respectively to the gates of the power semiconductors S1 and S2.

The gate driver GD1 controls the switching of the power semiconductors switch S1 using the signal Com1.

The gate driver GD2 controls the switching of the power semiconductors switch S2 using the signal Com2.

The present invention is disclosed in an example wherein the power semiconductors S1 and S2 are MOSFET but can be extended to any unipolar (JFET, IGFET, HEMT) or bipolar transistor (BJT or IGBT), only the name of the electrodes needing to be changed.

The drain of the power semiconductor switch S1 is connected to a positive power supply HV+ of a bus and the current going through the connection is sensed by a first current derivative sensing means 11 and a second current derivative sensing means 12.

The source of the power semiconductor switch S1 is connected to a load and to the drain of the power semiconductor switch S2.

The source of the power semiconductor switch S2 is connected to a negative power supply HV− of the bus and the current going through the connection is sensed by a third current derivative sensing means 13 and a fourth current derivative sensing means 14.

According to the invention, the output RD11 of the current derivative sensing means 11 is connected to a first low pass filter composed, for example, of a resistor R10 and C11 and the filtered output of the current derivative sensing means 11 is amplified by a first amplifier composed, for example, of a transistor T11 and a resistor R11. The ouput of the first amplifier is connected to the gate of the power semiconductor S1.

The output RD13 of the current derivative sensing means 13 is connected to a third low pass filter composed, for example, of a resistor R12 and C12 and the filtered output of the current derivative sensing means 13 is amplified by a third amplifier composed, for example, of a transistor T12 and a resistor R13. The ouput of the third amplifier is connected to the first amplifier.

A first output of the current derivative sensing means 11 is connected to a first terminal of the resistor R10. A second terminal of the resistor R10 is connected to a first terminal of the capacitor C11 and to the base of the transistor T11.

A second output of the current derivative sensing means 11 is connected to a second terminal of the capacitor C11 and to a first terminal of the resistor R11.

A second terminal of the resistor R11 is connected to the emitter of the transistor T11 and the collector of the transistor T11 is connected to the gate of the power semiconductor S1.

A first output of the current derivative sensing means 13 is connected to a first terminal of the resistor R12. A second terminal of the resistor R12 is connected to a first terminal of the capacitor C12 and to the base of the transistor T12.

A second output of the current derivative sensing means 13 is connected to a second terminal of the capacitor C12 and to a first terminal of the resistor R13.

A second terminal of the resistor R13 is connected to the emitter of the transistor T12 and to a first terminal of a resistor R14. The collector of the transistor T12 is connected to the first terminal of the resistor R11.

A second terminal of the resistor R14 is connected to a negative power supply Vee1.

The resistor R14 is connected in parallel to a first short-circuit detection module DT1 the output of which is connected to the gate driver GD.

The output RD12 of the current derivative sensing means 12 is connected to a second low pass filter composed, for example, of a resistor R15 and C13 and the filtered output of the current derivative sensing means 12 is amplified by a second amplifier composed, for example, of a transistor T13 and a resistor R16. The ouput of the second amplifier is connected to the gate of the power semiconductor S2.

The output RD14 of the current derivative sensing means 14 is connected to a fourth low pass filter composed, for example, of a resistor R17 and C14 and the filtered output of the current derivative sensing means 14 is amplified by a fourth amplifier composed, for example, of a transistor T14 and a resistor R18. The ouput of the fourth amplifier is connected to the second amplifier.

A first output of the current derivative sensing means 12 is connected to a first terminal of the resistor R15. A second terminal of the resistor R15 is connected to a first terminal of the capacitor C13 and to the base of the transistor T13.

A second output of the current derivative sensing means 12 is connected to a second terminal of the capacitor C13 and to a first terminal of the resistor R16.

A second terminal of the resistor R16 is connected to the emitter of the transistor T13 and the collector of the transistor T13 is connected to the gate of the power semiconductor S2.

A first output of the current derivative sensing means 14 is connected to a first terminal of the resistor R17. A second terminal of the resistor R17 is connected to a first terminal of the capacitor C14 and to the base of the transistor T14.

A second output of the current derivative sensing means 14 is connected to a second terminal of the capacitor C14 and to a first terminal of the resistor R18.

A second terminal of the resistor R18 is connected to the emitter of the transistor T14 and to a first terminal of a resistor R19. The collector of the transistor T14 is connected to the first terminal of the resistor R16.

A second terminal of the resistor R19 is connected to a negative power supply Vee2.

The resistor R19 is connected in parallel to a second short-circuit detection module DT2 the output of which is connected to the gate driver GD.

With a positive drain current slope, the output voltages RD11 and RD13 of the current derivative sensing means 11 and 13 are positive. With a negative source current slope, the output voltages RD12 and RD14 of current derivative sensing means 12 and 14 are negative.

The first, second, third and fourth low pass filters remove any possible spikes coming from the noisy environment by smoothing the signal provided by the current derivative sensing means 11, 12, 13 and 14. The time constant of the filters has to be chosen to ensure a proper filtering but also to guarantee the protection delay.

The filtered outputs are then amplified by the first, second, third and fourth amplifiers. Passing a given threshold, generally around 0.6 volts, the filtered output voltages put the transistors T11, T12, T13 and T14 into conduction. At this point, the transistors collector to emitter voltages are modulated by the base currents. This modulation is offering a possible current path through the bipolar transistors T11, T12, T13 and T14 lowering then gate signals of the power semiconductors S1 and S2.

Once the first and third amplifiers are activated, since the resistor R13 is connected to the negative power supply Vee1 through R14, the gate to source voltage of the power semiconductor S1 is pulled down to the negative power supply Vee1.

Once the second and fourth amplifiers are activated, since the resistor R18 is connected to the negative power supply Vee2 through R19, the gate to source voltage of the power semiconductor S2 is pulled down to the negative power supply Vee2.

Figure 2:
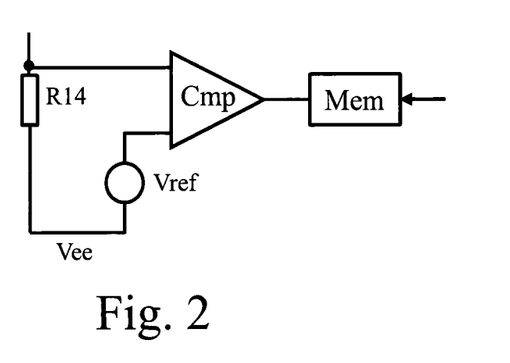
FIG. 2 represents an example of an architecture of a short-circuit detection module according to the present invention.

FIG. 2 represents an example of an architecture of a short-circuit detection module according to the present invention.

The short-circuit detection module DT1 is disclosed in FIG. 2, the architecture of the short-circuit detection module DT2 is identical to the one of the short-circuit detection module DT1.

The short-circuit detection module DT1 is composed of a comparator Cmp with Shmitt trigger, a memory module Mem and a reference voltage source Vref.

A positive input of the comparator Cmp is connected to the first terminal of the resistor R14. A first terminal of the reference voltage source Vref is connected to the negative power supply Vee1 and a second terminal of the reference voltage source Vref is connected to the negative input of the comparator Cmp.

The output of the comparator Cmp is connected to the memory Mem the output of which is connected to the gate driver GD1.

For the short circuit detection module DT2, the reference voltage source Vref is connected to the negative power supply Vee2 and the memory Mem output is connected to the gate driver GD2.

Figure 3:
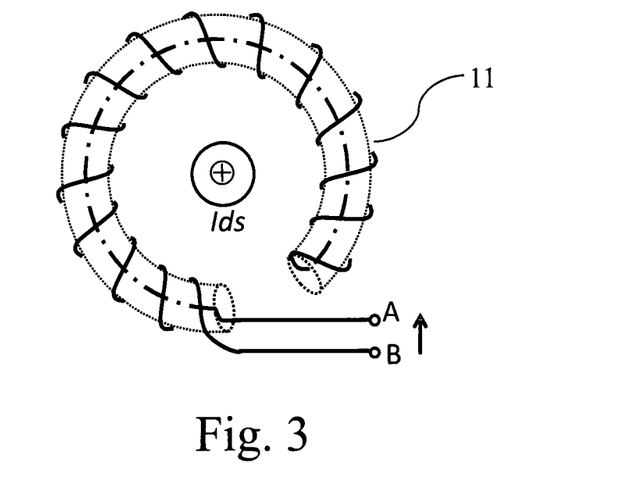
FIG. 3 represents an example of a current derivative sensing means used in the present invention.

FIG. 3 represents an example of a current derivative sensing means used in the present invention.

The current derivative sensing means is, in the example of FIG. 3, a Rogowski coil. A Rogowski coil is an electrical device for measuring high-speed current pulses. It consists of an helical coil of wire with the lead from one end returning through the centre of the coil to the other end, so that both terminals are at the same end of the coil. The whole assembly is then wrapped around the straight conductor whose current derivative is to be measured. There is no magnetic material core. The winding density, the diameter of the coil and the rigidity of the winding are critical for preserving immunity to external fields and sensitivity to the positioning of the measured conductor.

FIGS. 4a to 4d represent chronograms of signals provided according to the present invention.

Figure 4A:
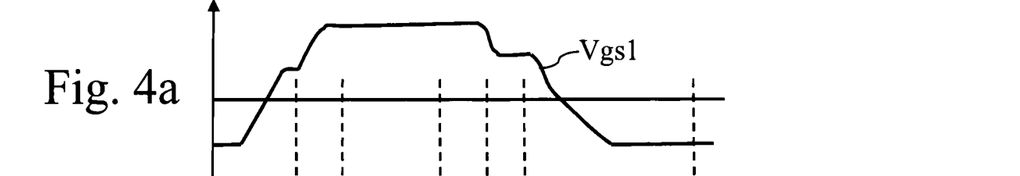
FIG. 4a represents the variation of the gate to source voltage of the power semiconductor S1 in the time.

The FIG. 4a represents the variation of the gate to source voltage of the power semiconductor S1 in the time.

Figure 4B:
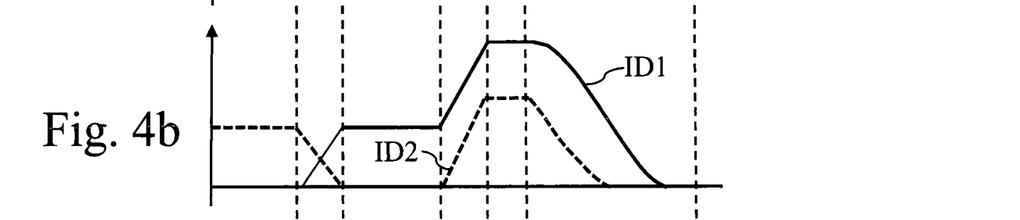
FIG. 4b represents the variation of the drain currents ID1 and ID2 of the power semiconductors S1 and S2 in the time.

The FIG. 4b represents the variation of the drain currents ID1 and ID2 of the power semiconductors S1 and S2 in the time.

Figure 4C:
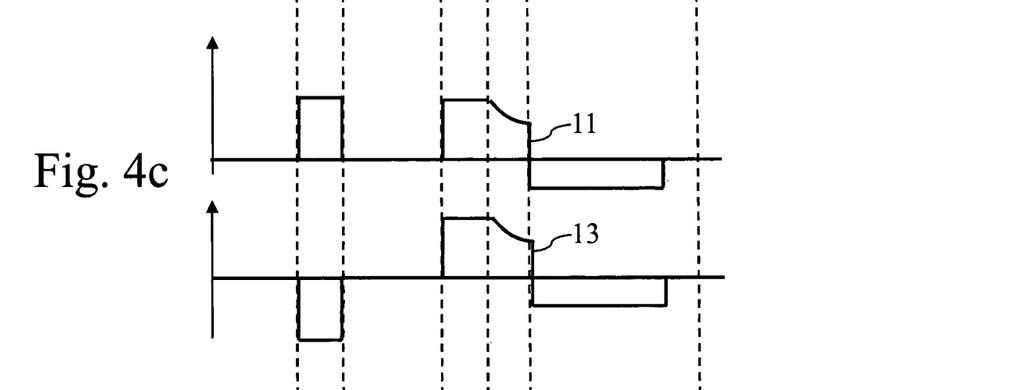
FIG. 4c represents the variation of the outputs of the first and third current derivative sensing means RD11 and RD13 in the time.

The FIG. 4c represents the variation of the outputs of the first and third current derivative sensing means RD11 and RD13 in the time.

Figure 4D:
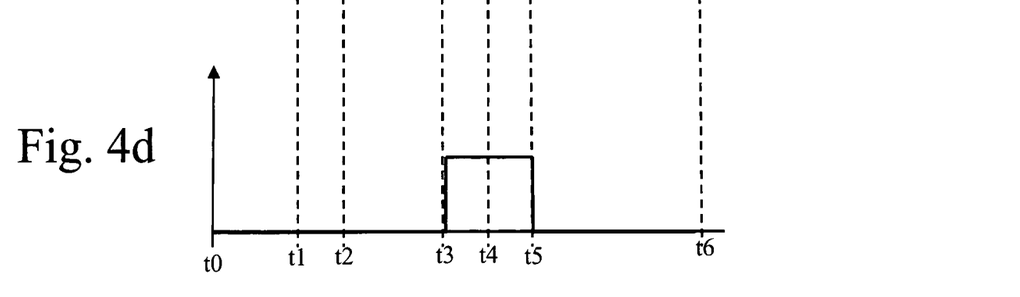
FIG. 4d represents the voltage drop variation of the resistor R14 over time.

The FIG. 4d represents the voltage drop variation of the resistor R14 over time.

At time t0, the load is sinking a current through the antiparallel diode of the power semiconductor S2. The gate to source voltages of the power semiconductors S1 and S2 are in a low state, i.e. at a negative voltage. No fast current transition happens on either the power semiconductor S1 or S2.

At time t1, the power semiconductor S1 is turned on by putting a positive voltage on the gate to source signal Vgs1 which corresponds to a high state. So, the drain current ID1 is rising in the power semiconductor S1 and the drain current ID2 is falling in the power semiconductor S2.

At time t1, the output voltage RD11 of the current derivative sensing means 11 becomes positive, the output voltage RD12, not shown in FIGS. 4, of the current derivative sensing means 12 becomes negative, the output voltage RD13 of the current derivative sensing means 13 becomes negative, the output voltage RD14, not shown in FIGS. 4, of the current derivative sensing means 14 becomes positive.

With a positive output voltage RD11 of the current derivative sensing means 11 and a negative output voltage RD13 of the current derivative sensing means 13, the series connection of the first and third amplifiers forms an AND logic function. Only when both transistors T11 and T12 are modulated by their base current, the current can run through both amplifiers.

Between t1 and t2, only one out of the first and third amplifiers is activated, putting the short-circuit protection in stand-by. The gate to source voltage VGS1 of the power semiconductor S1 is not modified by the outputs RD11 and RD13 of the current derivative sensing means 11 and 13.

At time t2, the current transition ends, the current in the power semiconductor S1 has reached the output current and the current in the power semiconductor S2 has reached zero. The load is solely supplied with a current coming from the voltage source through the power semiconductor S1. The current in the power semiconductor S1 is stabilized. Therefore, the output voltages of the current derivative sensing means 11 and 12 are null. No current flows in the power semiconductor S2, the outputs of the current derivative sensing means 13 and 14 are also null. The gate to source voltage of the power semiconductor S1 is positive as the gate to source voltage, not shown in FIGS. 4, of the power semiconductor S2.

At time t4, a short-circuit occurs between the source of the power semiconductor S1 and the negative voltage HV−.

The short-circuit can be a fault in the power semiconductor S2 or a fault outside of the switching cell effectively short-circuiting the power semiconductor S2 terminals. At this time, the current starts to rise in the power semiconductor S2 because of the short-circuit. In the power semiconductor S1, the current is also rising to provide both the short-circuit current and the load current.

Since the drain current ID1 slope is positive, the output voltages of the current derivative sensing means 11 and 12 are positive. Similarly, the output voltages of the current derivative sensing means 13 and 14 are also positive.

At time t4, the gate to source voltage Vgs1 of the power semiconductor $S_1$ is decreasing towards the negative power supply Vee1 thanks to the conduction of the transistors T11 and T12. The reduced gate voltage affects the gain, here the transconductance, of the power semiconductor switch S1 resulting in a lower current in the power semiconductor S1. The current reduction helps extending the short-circuit time that the switch can withstand.

At time t5, the gate to source voltage Vgs1 is stabilized at a steady state that depends on the gain of the current derivative sensing means and the amplifiers one. From time t3 to t5, a current is flowing through the first and third amplifiers and also through the resistor R14 creating a voltage drop at the resistor R14 terminals. The voltage between the terminals of resistor R14 is the voltage used the short circuit detection module DT1. Between t3 and t5, the voltage between the terminals of resistor R14 is at a high level, then the short circuit detection module DT1 outputs a high signal to the gate driver GD1 and at time t5, the gate driver GD1 turns of the power semiconductor S1. The currents in the power semiconductors S1 and S2 are falling. With a negative slope, the output voltages of current derivative sensing means 11 and 14 are negative.

All amplifiers are desactivated leading to a low state voltage between the terminals of resistor R14. At time T6, the power semiconductor S1 is turned off and no current flows in both power semiconductors S1 and S2.

Conversely, for a short-circuit taking place between the drain of the power semiconductor S2 and the positive voltage HV+ while the power semiconductor S2 is in the on state, the above description may be read replacing the power semiconductor S1 by the power semiconductor S2 and the power semiconductor S2 by the power semiconductor S1.

Figure 5:
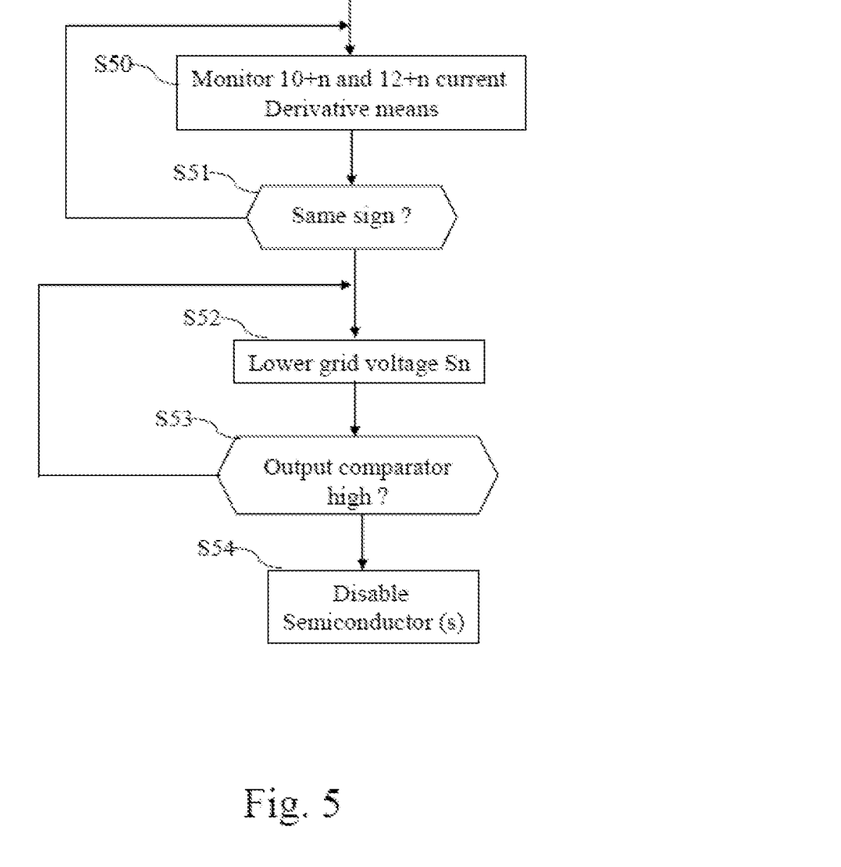
FIG. 5 represents an algorithm executed according to the present invention.

FIG. 5 represents an algorithm executed according to the present invention.

The present algorithm is executed in parallele for each power semiconductor Sn with n=1 or 2.

At step S50, the system for protecting at least two power semiconductors of a half bridge converter monitors the outputs of the current derivative sensing means 10+n and 12+n i.e. the current derivative means 11 and 13 or the current derivative means 12 and 14.

At next step S51, the system for protecting at least two power semiconductors of a half bridge converter checks if the outputs of the current derivative sensing means 10+n and 12+n have the same sign.

If the outputs of the current derivative sensing means 10+n and 12+n have the same sign, the system for protecting at least two power semiconductors of a half bridge converter moves to step S52. Otherwise, the system for protecting at least two power semiconductors of a half bridge converter returns to step S50.

At step S52, the system for protecting at least two power semiconductors of a half bridge converter decreases the voltage on the gate of the first power semiconductor.

At step S53, the system for protecting at least two power semiconductors of a half bridge converter checks if the output of the short-circuit detection module DTn is at a high level.

If the output of the short-circuit detection module DTn is at a high level, the system for protecting at least two power semiconductors of a half bridge converter moves to step S54. Otherwise, the system for protecting at least two power semiconductors of a half bridge converter returns to step S52.

At step 54, the system for protecting at least two power semiconductors of a half bridge converter disables the grid signal provided to the power semiconductors.

Naturally, many modifications can be made to the embodiments of the invention described above without departing from the scope of the present invention.

The invention claimed is:

1. A system for protecting at least two power semiconductors of a half bridge converter, a drain of a first power semiconductor being connected to a positive power supply, a source of the first power semiconductor being connected to a load and to a drain of a second power semiconductor, a source of the second power semiconductor being connected to a negative power supply, wherein the current going through the first power semiconductor is sensed by a first Rogowski coil and a second Rogowski coil, the current going through the second semiconductor is sensed by a third Rogowski coil and a fourth Rogowski coil, the first Rogowski coil providing a positive voltage when the current going through the first power semiconductor increases and the second Rogowski coil providing a negative voltage when the current going through the first power semiconductor increases, the third Rogowski coil providing a positive voltage when the current going through the second power semiconductor increases and the fourth Rogowski coil providing a negative voltage when the current going through the second power semiconductor increases, and in that the system comprises:
circuitry for lowering the voltage on the gate of the first power semiconductor if the first and third Rogowski coils provide voltages of same sign,
circuitry for lowering the voltage on the gate of the second power semiconductor if the second and fourth Rogowski coils provide voltages of same sign.

2. The system according to claim 1, wherein the system further comprises, for each Rogowski coil, a filter for filtering the voltage provided by the Rogowski coil.

3. The system according to claim 2, wherein the system further comprises, for each Rogowski coil, an amplifier for amplifying the filtered voltage provided by the Rogowski coil.

4. The system according to claim 3, wherein the amplifier amplifying the filtered signal provided by the first Rogowski coil is composed of a first transistor and a first resistor, the collector of the first transistor is connected to the gate of the first power semiconductor device, the emitter of the first transistor is connected to a first terminal of the first resistor, the amplifier amplifying the filtered signal provided by the third Rogowski coil is composed of a second transistor and a second resistor, the collector of the second transistor is connected to a second terminal of the first resistor, the emitter of the second transistor connected to a first terminal of the second resistor and the second terminal of the second resistor is linked to a first negative voltage source.

5. The system according to claim 4, wherein the system further comprises circuitry for interrupting the providing of signals to the gate of the first power semiconductor if the first and third Rogowski coils provide voltages of same sign, the circuitry for interrupting the providing of signals to the gate of the first power semiconductor comprising a third resistor, a first comparator the output of which is connected to a gate driver of the first power semiconductor and a third resistor that links the second terminal of the second resistor to the negative voltage source.

6. The system according to claim 5, wherein the amplifier amplifying the filtered signal provided by the second Rogowski coil is composed of a third transistor and a fourth resistor, the collector of the third transistor is connected to the gate of the second power semiconductor device, the emitter of the third transistor is connected to a first terminal of the fourth resistor, the amplifier amplifying the filtered signal provided by the third Rogowski coil is composed of a fourth transistor and a fifth resistor, the collector of the fourth transistor is connected to a second terminal of the fourth resistor, the emitter of the fourth transistor is connected to a first terminal of the fifth resistor and the second terminal of the fifth resistor is linked to a second negative voltage source.

7. The system according to claim 5, wherein the system further comprises circuitry for interrupting the providing of signals to the gate of the second power semiconductor if the second and fourth Rogowski coils provide voltages of same sign, the circuitry for interrupting the providing of signals to the gate of the second power semiconductor comprising a sixth resistor, a comparator the output of which is connected to a gate driver of the first power semiconductor, and a resistor that links the second terminal of the second resistor to the second negative voltage source.

8. The system according to claim 7, wherein the circuitry for interrupting the providing of signals to the gate of the power semiconductors further comprise a memory that memorizes a low to high transition of the comparator.

9. A method for protecting at least two power semiconductors of a half bridge converter, a drain of a first power semiconductor being connected to a positive power supply, a source of the first power semiconductor being connected to a load and to a drain of a second power semiconductor, a source of the second power semiconductor being connected to a negative power supply, wherein the current going through the first power semiconductor is sensed by a first Rogowski coil and a second Rogowski coil, the current going through the second semiconductor is sensed by a third Rogowski coil and a fourth Rogowski coil, the first Rogowski coil providing a positive voltage when the current going through the first power semiconductor increases and the second Rogowski coil providing a negative voltage when the current going through the first power semiconductor increases, the third Rogowski coil providing a positive voltage when the current going through the second power semiconductor increases and the fourth Rogowski coil providing a negative voltage when the current going through the second power semiconductor increases, and in that the method comprises the steps of:
lowering the voltage on the gate of the first power semiconductor if the first and third Rogowski coils provide voltages of same sign, lowering the voltage on the gate of the second power semiconductor if the second and fourth Rogowski coils provide voltages of same sign.

* * * * *